US011289121B2

(12) United States Patent
Kikuchi et al.

(10) Patent No.: US 11,289,121 B2
(45) Date of Patent: Mar. 29, 2022

(54) SUSPENSION ASSEMBLY, HEAD SUSPENSION ASSEMBLY AND DISK DEVICE WITH THE SAME

(71) Applicant: Kabushiki Kaisha Toshiba, Tokyo (JP)

(72) Inventors: Takafumi Kikuchi, Yokohoma Kanagawa (JP); Kenichiro Aoki, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/150,392

(22) Filed: Jan. 15, 2021

(65) Prior Publication Data

US 2021/0134322 A1 May 6, 2021

Related U.S. Application Data

(63) Continuation of application No. 16/745,889, filed on Jan. 17, 2020, now Pat. No. 10,916,264, which is a continuation of application No. 15/677,747, filed on Aug. 15, 2017, now Pat. No. 10,573,339, which is a continuation of application No. 15/374,276, filed on
(Continued)

(30) Foreign Application Priority Data

Mar. 12, 2015 (JP) .................................. 2015-049807

(51) Int. Cl.
*G11B 5/48* (2006.01)
*H05K 1/18* (2006.01)

(52) U.S. Cl.
CPC ............... *G11B 5/483* (2015.09); *G11B 5/48* (2013.01); *G11B 5/486* (2013.01); *G11B 5/4853* (2013.01); *G11B 5/484* (2013.01); *G11B 5/4833* (2013.01); *H05K 1/18* (2013.01)

(58) Field of Classification Search
None
See application file for complete search history.

(56) References Cited

U.S. PATENT DOCUMENTS 8,854,826 B2   10/2014  Ohsawa
8,988,831 B1    3/2015  Kido et al.
(Continued)

FOREIGN PATENT DOCUMENTS

CN   101546562 A   9/2009
CN   101751938 A   6/2010
(Continued)

*Primary Examiner* — Carlos Garcia
(74) *Attorney, Agent, or Firm* — Allen & Overy LLP

(57) ABSTRACT

According to one embodiment, a suspension assembly includes a support plate, a trace member on the support plate and a drive element mounted on the trace member. The trace member includes a metal plate, and a multilayered member on the metal plate. The multilayered member includes a first insulating layer, a conductive layer stacked on the first insulating layer, a second insulating layer stacked on the conductive layer. The multilayered member includes a mount portion on which the drive element is mounted, and a branching portion arranged along the mount portion with a gap therebetween. At least one portion of the branching portion is formed into a thin portion having a thickness less than other portions of the multilayered member.

8 Claims, 8 Drawing Sheets

Related U.S. Application Data

Dec. 9, 2016, now Pat. No. 9,761,255, which is a continuation of application No. 14/741,649, filed on Jun. 17, 2015, now Pat. No. 9,530,441.

(56) References Cited

U.S. PATENT DOCUMENTS

| | | |
|---|---|---|
| 9,530,441 B2 | 12/2016 | Kikuchi et al. |
| 2004/0125509 A1 | 7/2004 | Yang et al. |
| 2005/0037139 A1 | 2/2005 | Fujisaki et al. |
| 2008/0180850 A1 | 7/2008 | Rice et al. |
| 2009/0244786 A1 | 10/2009 | Hatch |
| 2009/0310908 A1 | 12/2009 | Kanagawa et al. |
| 2011/0096438 A1 | 4/2011 | Takada et al. |
| 2011/0317312 A1 | 12/2011 | Yamaguchi |
| 2012/0287536 A1 | 11/2012 | Kuwajima |
| 2014/0022671 A1 | 1/2014 | Takikawa et al. |
| 2018/0018993 A1* | 1/2018 | Kikuchi .................. G11B 5/48 |

FOREIGN PATENT DOCUMENTS

| | | |
|---|---|---|
| CN | 102446515 A | 5/2012 |
| CN | 103578490 A | 2/2014 |
| JP | 2003-187542 A | 7/2003 |
| JP | 2007-133929 A | 5/2007 |
| JP | 2008-186567 A | 8/2008 |
| JP | 2012-9111 A | 1/2012 |
| JP | 2012-018742 A | 1/2012 |
| JP | 2012-238350 A | 12/2012 |
| JP | 2014-149899 A | 8/2014 |

* cited by examiner

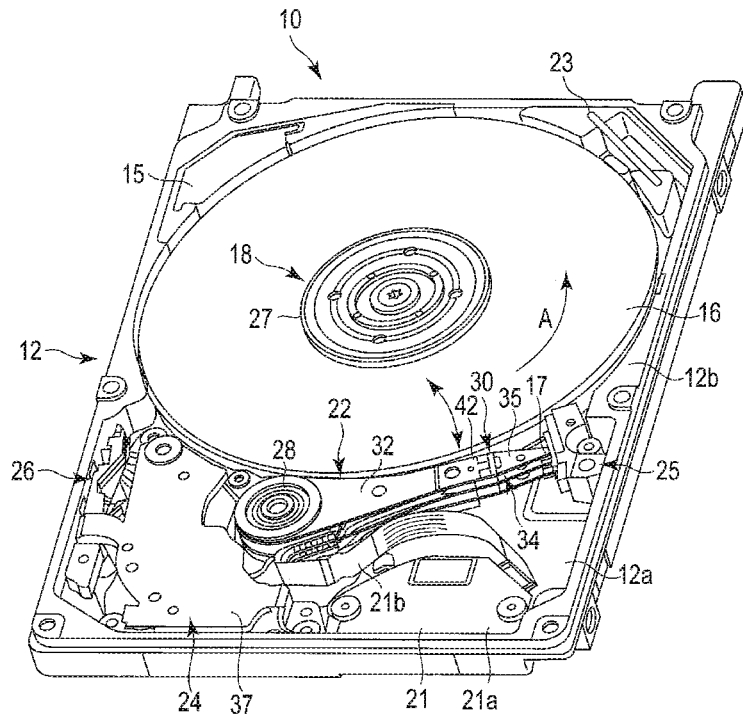
F I G. 1
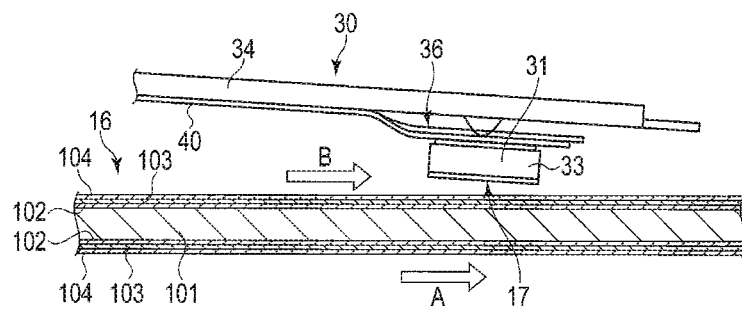
F I G. 2

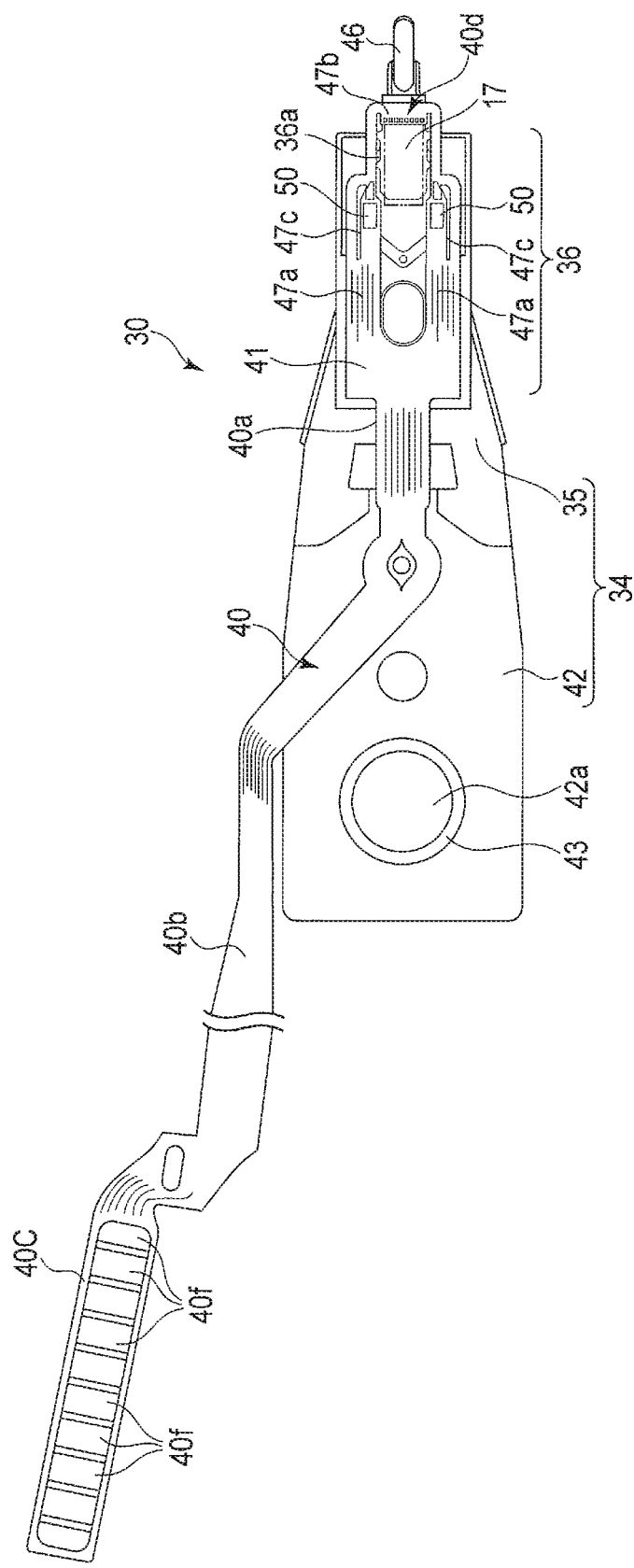
F I G. 3

| | | Ratio |
|---|---|---|
| (a) | No thin portion formed in base insulating layer | (1.00) |
| (b) | Thin portion formed in base insulating layer of second bridge portion | (1.03) |
| (c) | Thin portion formed in base insulating layers of both first and second bridge portions | (0.98) |
F I G. 8
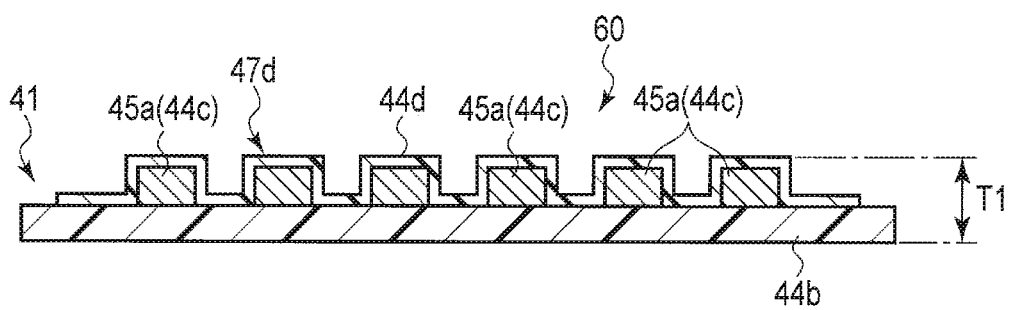
F I G. 9
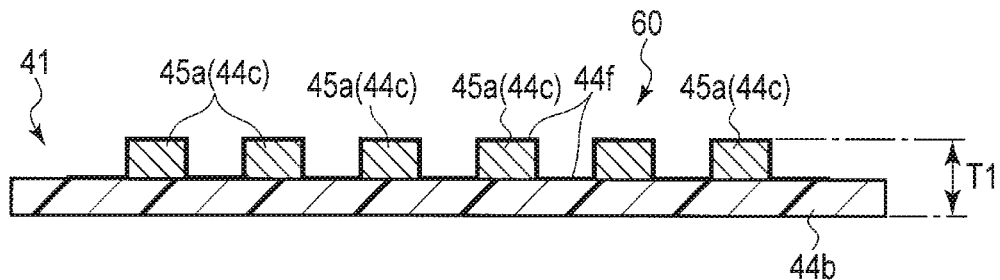
F I G. 10

SUSPENSION ASSEMBLY, HEAD SUSPENSION ASSEMBLY AND DISK DEVICE WITH THE SAME

CROSS-REFERENCE TO RELATED APPLICATIONS

This application is a continuation of application Ser. No. 16/745,889 filed Jan. 17, 2020, which is a continuation of application Ser. No. 15/677,747 filed Aug. 15, 2017 (now U.S. Pat. No. 10,573,339, which is a continuation of application Ser. No. 15/374,276 filed Dec. 9, 2016 (now U.S. Pat. No. 9,761,255), which is a continuation of application Ser. No. 14/741,649 filed Jun. 17, 2015 (now U.S. Pat. No. 9,530,441) and is based upon and claims the benefit of priority from Japanese Patent Application No. 2015-049807, filed Mar. 12, 2015, the entire contents of each are incorporated herein by reference.

FIELD

Embodiments described herein relate generally to a suspension assembly, a head suspension assembly and a disk device with the same.

BACKGROUND

In recent years, disk devices such as magnetic disk devices and optical disc devices are widely used as external storage devices for computers and image recorders.

As a disk device, for example, the magnetic disk device generally includes a magnetic disk provided in a base, a spindle motor configured to support and rotate the magnetic disk and a suspension assembly configured to support a magnetic head. The suspension assembly includes a suspension attached to a distal end portion of an arm, a trace member (flexure, wiring trace) disposed on the suspension, and a load beam. The magnetic head is supported on a gimbal portion of the trace member, thus forming a head suspension assembly.

In recent years, such a suspension assembly has been proposed, in which a piezoelectric element (PZT element) as a drive element is mounted in the vicinity of the gimbal portion of the trace member, and thus the magnetic head is minutely displaced in a seek direction by expansion/contraction of the piezoelectric element. According to this suspension assembly, it is possible to finely control the movement of the magnetic head by controlling the voltage supplied to the piezoelectric element.

In the suspension assembly such as above, when the piezoelectric element expands or contracts by voltage application, the piezoelectric element may curve in the thickness direction. In this case, part of expansion or contraction of the piezoelectric element escapes in the curving direction of the piezoelectric element and the displacement (stroke) of the magnetic head decreases. For this reason, it becomes difficult to control the displacement of the magnetic head in line with the displacement of the piezoelectric element.

BRIEF DESCRIPTION OF THE DRAWING

FIG. 1 is a perspective view showing a hard disk drive (HDD) according to a first embodiment;

FIG. 2 is a side view showing a magnetic head and a suspension of a head suspension assembly, and a magnetic disk in the HDD;

FIG. 3 is a plan view of the head suspension assembly;

FIG. 8 is a diagram showing strokes obtained by expansion/contraction of a drive element for various types of trace members in comparison;

FIG. 9 is a cross sectional view of a thin part of a trace member in a suspension assembly according to a second embodiment;

FIG. 10 is a cross sectional view of a thin part of a trace member in a suspension assembly according to a third embodiment;

DETAILED DESCRIPTION

Figure 4:
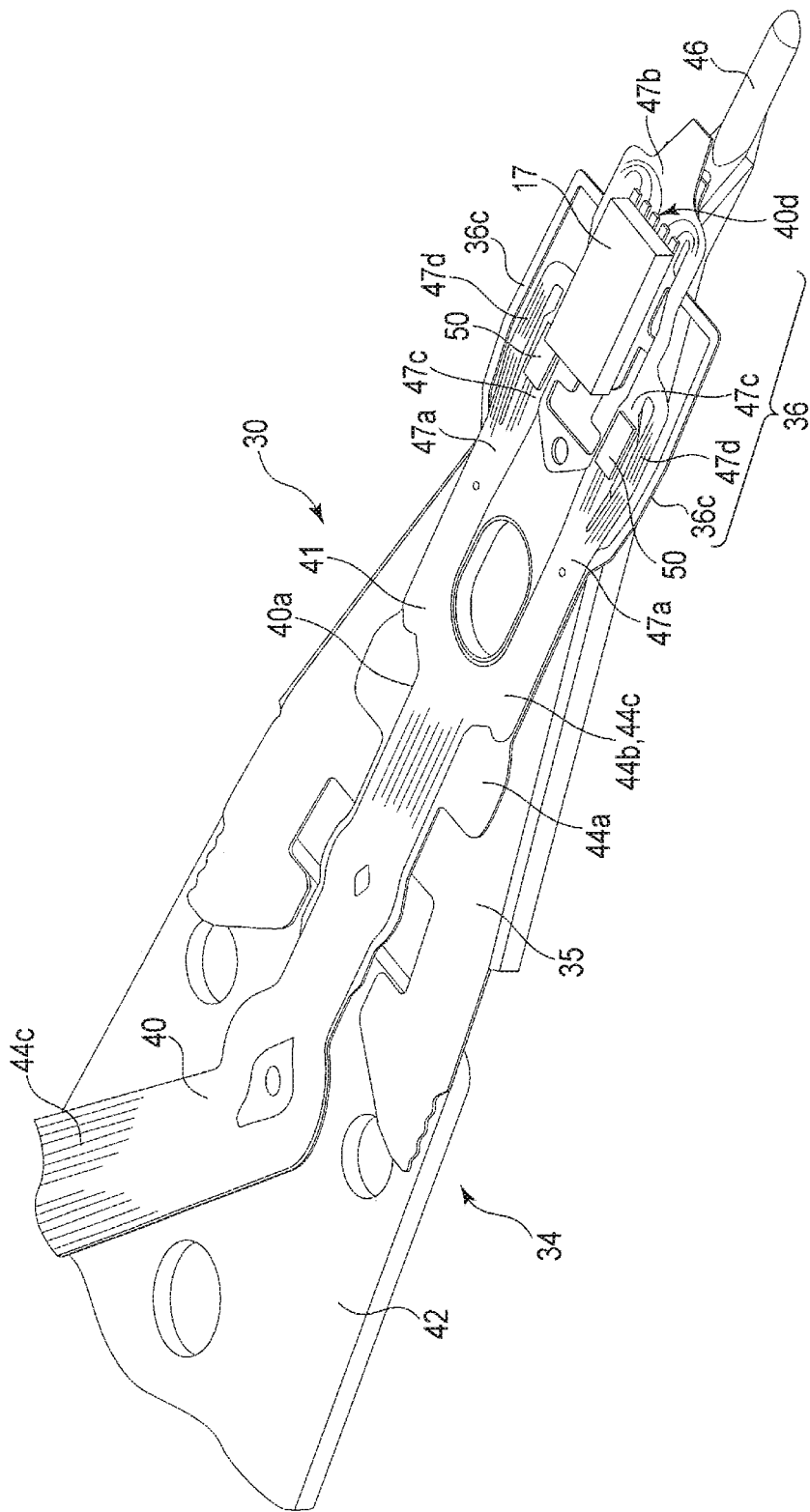
FIG. 4 is a perspective view of the head suspension assembly.

Various embodiments will be described hereinafter with reference to the accompanying drawings. In general, according to one embodiment, a suspension assembly comprises a support plate; a trace member provided on the support plate; and an expandable/contractable drive element mounted on the trace member. The trace member comprises a metal plate including an end portion fixed to the support plate, and a multilayered member on the metal plate. The multilayered member comprises a first insulating layer, a conductive layer stacked on the first insulating layer, and a second insulating layer stacked on the conductive layer. The multilayered member includes a mount portion on which the drive element is mounted, and a branching portion arranged along the mount portion with a gap therebetween. The branching portion comprises at least one portion formed into a thin portion having a thickness less than other portions of the multilayered member.

Hereafter, as disk devices, hard disk drives (HDD) according to embodiments will now be described in detail.

First Embodiment

FIG. 1 shows an internal structure of an HDD when a top cover is removed. As shown in FIG. 1, the HDD includes a housing 10. The housing 10 includes a base 12 of a rectangle box shape with an upper surface opened, and a top cover (not shown) configured to cover the upper end opening of the base 12. The base 12 includes a bottom wall 12a of rectangular shape and sidewalls 12b set to rise along the side edges of the bottom wall 12a.

The housing 10 accommodates therein two magnetic disks 16 as recording media, and a spindle motor 18 as a drive section configured to support and rotate the magnetic disks 16. The spindle motor 18 is provided on the bottom wall 12a. The magnetic disks 16 are fitted coaxially on a hub (not shown) of the spindle motor 18, and clamped with a clamp spring 27, thus fixed to the hub. The magnetic disks 16 are supported parallel to the bottom wall 12a of the base 12. The magnetic disks 16 are rotated by the spindle motor 18 in a direction of arrow A at a particular speed.

The housing 10 accommodates therein a plurality of magnetic heads 17 configured to write and read data to and from the magnetic disks 16, and a head stack assembly (referred to as HSA hereafter) 22 configured to support these magnetic heads 17 so as to be movable with respect to the magnetic disks 16.

Further, the housing 10 accommodate a voice coil motor (referred to as VCM hereafter) 24 configured to rotate and position the HSA 22, a ramped loading mechanism 25 configured to hold the magnetic head 17 at an unloading position away from the respective magnetic disk 16 when the magnetic head 17 is moved to the outermost periphery of the magnetic disk 16, a latch mechanism 26 configured to hold the HSA 22 in an evacuation position when a shock or the like acts on the HDD, and a substrate unit 21 including a conversion connector, etc.

Onto an outer surface of the bottom wall 12a of the base 12, a printed circuit board (not shown) is fixed by screws. The printed circuit board is configured to control the operations of the VCM 24 and the magnetic heads 17 through the substrate unit 21, and control the spindle motor 18. In the sidewall 12b of the base 12, a circulation filter 23 is provided to capture the dust generated in the housing 12 by operation of movable members, to be located in the outside of the magnetic disks 16. The sidewall 12b is provided with a respiratory filter 15 configured to capture dust from the air flowing into the housing 10.

As shown in FIG. 1, the HSA 22 comprising a rotatable bearing unit 28, four arms 32 attached to the bearing unit 28 in a stacking state, a suspension assembly 30 extending from each of the arms 32 and spacer rings (not shown) arranged to stack between the arms 32, respectively. Each arm 32 is formed of, for example, stainless steel or aluminum into the shape of a slim plate. Each arm 32 includes a distal end portion on an extending end side, and the distal end portion includes a bearing surface with holes for caulking (not shown), formed therein.

The HSA 22 comprises a support frame extending in a direction opposite to the arms 32 from the bearing unit 28, and a voice coil, which is a part of the VCM 24, is embedded in the support frame. The voice coil is located between a pair of yokes 37 mounted on the base 12 and constitutes the VCM 24 together with these yokes 37 and a magnet (not shown) fixed to one of the yokes 37.

As shown in FIG. 1, the substrate unit 21 comprises a main substrate 21a and a relay flexible printed circuit board (FPC) 21b extending out from the main substrate 21a of the unit. An extending end of the relay FPC 21b constitutes a connection end portion and is being fixed to the vicinity of the bearing unit 28 of the HSA 22. A connection end 40c (FIG. 3) of a flexure (trace member) 40 of each suspension assembly 30, which will be described later, is mechanically and electrically connected to the connection end portion of the relay FPC 21b. With this structure, the substrate unit 21 is electrically connected to the magnetic head 17 and a drive element through the relay FPC 21b and the flexure 40.

FIG. 2 schematically shows a magnetic head in a flying state and the magnetic disk. As shown in FIGS. 1 and 2, the magnetic disk 16 comprises a substrate 101 of, for example, a nonmagnetic material formed into a disk having a diameter of about 2.5 inches (6.35 cm). On both surfaces of the substrate 101, a soft magnetism layer 102 of a material exhibiting soft magnetic characteristics is formed as an underlying layer, a magnetic recording layer 103 is formed thereon and a protective film layer 104 is formed thereon in this order while stacking one on another.

As shown in FIG. 2, the magnetic head 17 is formed as a flying-type head and comprises a slider 31 formed into a substantially rectangular parallelepiped shape and a head portion 33 formed in an end portion on the (trailing) side of an outflow end of the slider 31. The magnetic head 17 is supported on the distal end portion of the suspension 34 through a gimbal portion 36 of the flexure, which will be described later. The magnetic head 17 flies by air flow B produced between the surface of the magnetic disk 16 and the slider 31 by rotation of the magnetic disk 16. The direction of the air flow B coincides with the direction of rotation A of the magnetic disk 16. The slider 31 is arranged so that the longitudinal direction of the slider 31 substantially coincides with the direction of the air flow B with respect to the surface of the magnetic disk 16.

Next, the structure of the suspension assembly 30 will now be described in detail. FIG. 3 is a plan view of the suspension assembly and FIG. 4 is a perspective diagram of the suspension assembly.

As shown in FIGS. 1, 3 and 4, the suspension assembly 30 comprises a suspension 34 extending out from the respective arm 32, and the respective magnetic head 17 is attached to the distal end portion of this suspension 34. Note that a set of a magnetic head 17 and a suspension assembly 30 supporting the magnetic head as a unit is called a head suspension assembly.

The suspension 34 which functions as a support plate comprises a rectangular base plate 42 of a metal plate having a thickness of several hundred micrometers and a load beam 35 having an elongated plate spring form of a metal plate having a thickness of several tens of micrometers. The load beam 35 is fixed to the base plate 42 as a proximal end portion is overlaid on the distal end portion of the base plate 42 and they are welding together by a plurality of locations. The width of the proximal end portion of the load beam 35 is formed substantially equally to the width of the base plate 42. At the distal end of the load beam 35, a slim rod-shaped tab 46 is provided to protrude therefrom.

The base plate 42 comprises a circular opening 42a provided at the proximal end portion thereof, an annular projection 43 located along the circumference of the opening 42a. The base plate 42 is jointed to the distal end portion of the arm 32 by fitting the projection 43 into a circular hole for calking (not shown) formed in the bearing surface of the arm 32, and caulking the projection 43. The proximal end of the base plate 42 may be fixed to the distal end of the arm 32 by laser welding, spot welding or adhesion.

The suspension assembly 30 comprises a pair of piezoelectric elements (PZT elements) 50, and an elongate belt-shaped flexure (trace member) 40 configured to transmit recording and reading signals and drive signals of the piezoelectric element 50. As shown in FIGS. 3 and 4, the flexure 40 extends along a side edge of the arm 32 as the distal end portion 40a is attached on the load beam 35 and the base plate 42 and the latter half (extending portion) 40b extends out from the side edge of the base plate 42. The connection end 40c located at the tip of the extending portion 40b comprises a plurality of contact pads 40f and the contact pads 40f are connected to the aforementioned relay FPC 21b.

The distal end portion of the flexure 40 is located above the distal end portion of the load beam 35 and forms the gimbal portion 36 which functions as an elastic support member. The magnetic head 17 is placed and fixed on the gimbal portion 36, and is supported by the load beam 35 through the gimbal portion 36. A pair of piezoelectric elements 50 as drive elements are attached to the gimbal portion 36 and are located in the proximal end side of the load beam 35 with respect to the magnetic head 17.

Figure 5:
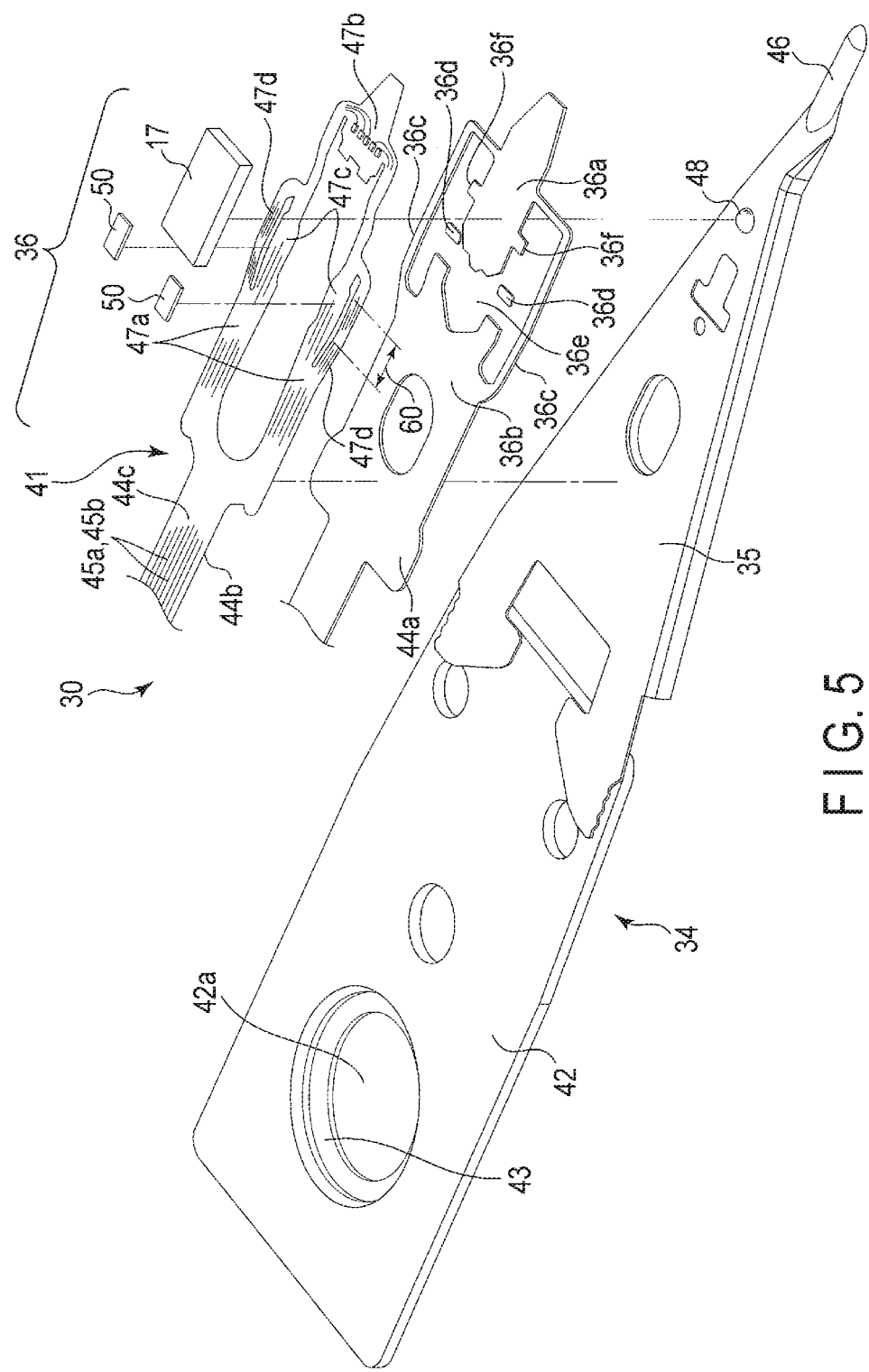
FIG. 5 is an exploded perspective view showing the magnetic head, a piezoelectric element, a wring member and a load beam of the suspension assembly.
Figure 6:
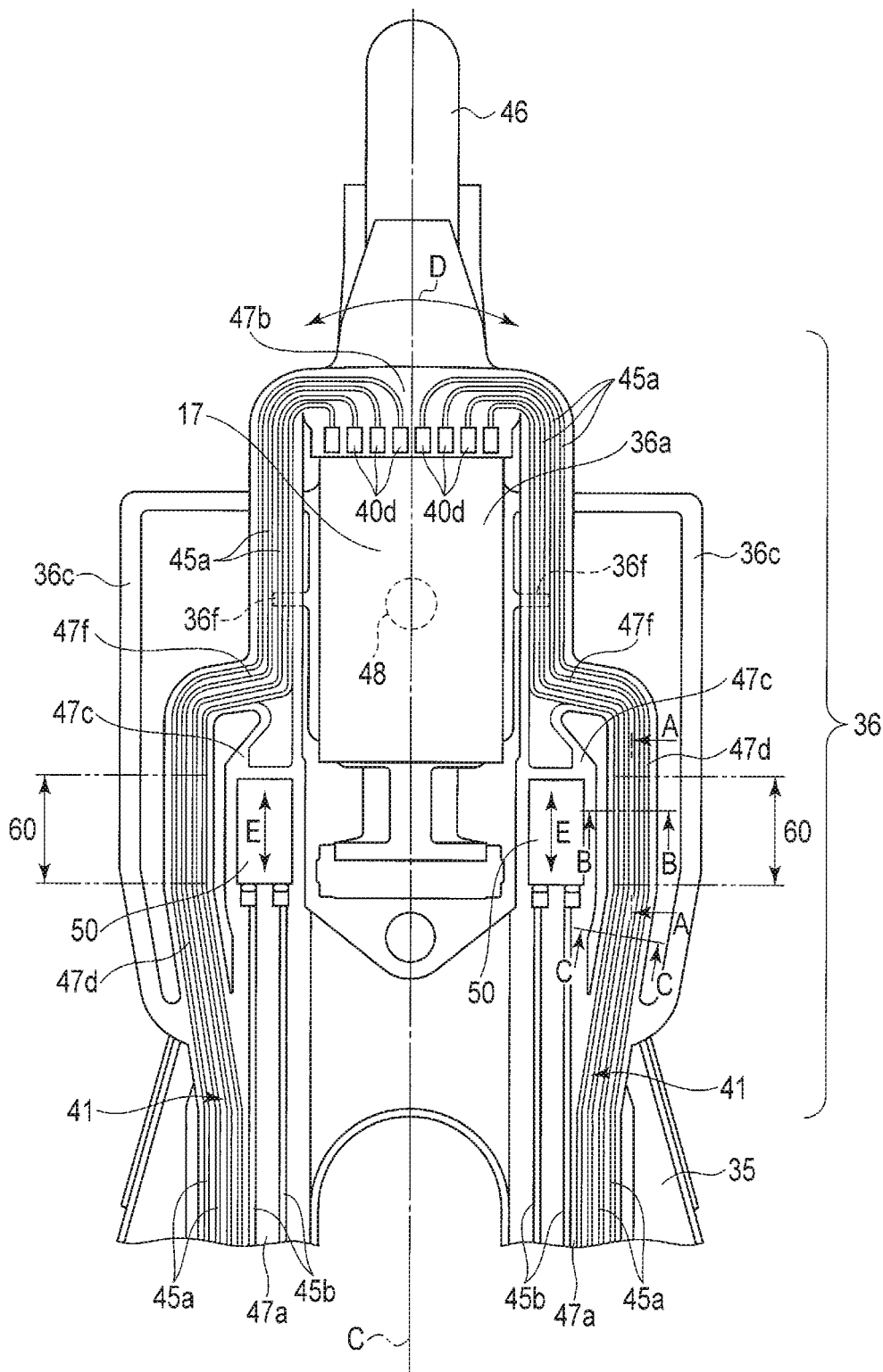
FIG. 6 is a plan view of a distal end portion of the suspension assembly.

FIG. 5 is an exploded perspective view of the piezoelectric element, flexure, load beam and magnetic head of the suspension assembly, and FIG. 6 is an enlarged plan view showing a distal end portion of the suspension assembly.

As shown in FIGS. 3 to 6, the flexure 40 comprises a thin metal plate (metal plate) 44a of stainless steel or the like, used as a base, and a belt-shaped multilayered member 41 attached or adhered to the thin metal plate 44a, which are shaped into a slim multilayer plate.

The multilayered member 41 comprises a base insulating layer (first insulating layer) 44b, most of which is fixed to the thin metal plate 44a, a conductive layer (trace pattern) 44c formed on the base insulating layer 44b and comprising a plurality of signal trace lines 45a and drive trace lines 45b and a cover insulating layer (second insulating layer) 44d (FIG. 7A and FIG. 7B) stacking on the base insulating layer 44b so as to cover the conductive layer 44c. The distal end portion 40a of the flexure 40 is attached, with its thin metal plate 44a side, to the surfaces of the load beam 35 and the base plate 42, or welded thereto by spot welding by a plurality of welding points.

In the gimbal portion 36 of the flexure 40, the thin metal plate 44a comprises a rectangular tongue portion (support portion) 36a located in an proximal end side thereof, a substantially rectangular proximal end portion (proximal end plate member) 36b located in a proximal end side while sandwiching the tongue portion 36a and a space 36e, a pair of slim outriggers (link portion) 36c extending from the tongue portion 36a to the proximal end portion 36b, a pair of island-shaped separating plates 36d provided in the space 36e between the tongue portion 36a and the proximal end portion 36b and a pair of handles (supporting projections) 36f projecting from both side edges of the tongue portions 36 to the both sides.

The proximal end portion 36b is attached or fixed by spot welding on the surface of the load beam 35. The tongue portion 36a is formed to have a size and shape on which the magnetic head 17 can be mounted, for example, into a substantially rectangular shape. The tongue portion 36a is arranged so that the central axis thereof in its width direction coincides with the central axis C of the suspension 34. Further, the tongue portion 36a is arranged so that the substantially central portion thereof contacts a dimple (projecting portion) 48 provided in a distal end portion of the load beam 35. Furthermore, the tongue portion 36a can be displaced in various directions when the pair of outriggers 36c elastically deform. With this structure, the tongue portion 36a and the magnetic head 17 mounted on the tongue portion 36a are able to flexibly follow surface fluctuation of the magnetic disk 16 in rolling and pitching directions, thereby making it possible to maintain a narrow gap between the surface of the magnetic disk 16 and the magnetic head 17. A pair of handles 36f are formed of the thin metal plate 44a to be integrated with the tongue portion 36a and project from both side-edges of the tongue portion 36a in directions which intersect substantially perpendicularly with the central axis C. The handles 36f may be formed of, not only the thin metal plate 44a itself, but also the conductive layer 44c, the base insulating layer 44b or the cover insulating layer 44d stacked on the thin metal plate 44a.

In the gimbal portion 36, a portion of the multilayered member 41 of the flexure 40 separates into two parts, which are located on both sides of the central axis C of the suspension 34. The multilayered member 41 comprises a proximal end portion 47a fixed on the proximal end portion 36b of the thin metal plate 44a, a distal end portion 47b attached on the tongue portion 36a, a pair of belt-shaped first bridge portions 47c extending from the proximal end portion 47a to the distal end portion 47b above through the separation plates 36d, and a pair of belt-shaped second bridge portions (branch portions) 47d extending along with the first bridge portions 47c from the proximal end portion 47a to the halfway point of the first bridge portions 47c and emerging with the first bridge portions 47c. Each of the first bridge portions 47c forms a mounting portion on which the drive element, described later, is to be mounted. The first bridge portions 47c are located on both respective sides of the tongue portion 36a along with the outriggers 36c, and extend substantially parallel to the central axis C of the suspension 34, that is, along the longitudinal direction of the load beam 35. Further, the first bridge portions 47c extend through above the handles 36f and the crossbars of the outriggers 36c, and are partially fixed thereto. Furthermore, the first bridge portions 47c are arranged so that the proximal end side portions, the distal end side portions and the middle portions are located on the thin metal plate 44a. Note that the outriggers 36c may be provided between the tongue portion 36a and the first bridge portions 47c, respectively, in which case, the first bridge portions 47c are partially fixed to the handles 36f. The pair of island-shaped separation plates 36d of the thin metal plate 44a are fixed to the lower surfaces of the first bridge portions 47c between a merging portion 47f and the proximal end portion 47a.

Figure 7A:
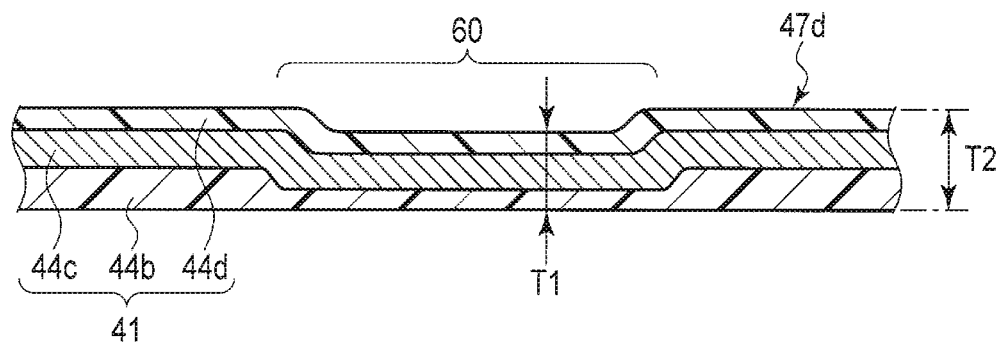
FIG. 7A is a longitudinal sectional view of a branching portion (bridge portion) of the trace member taken along line A-A in FIG. 6.

As shown in FIG. 6 and FIG. 7A, each of the second bridge portions 47d is located between the respective first bridge portion 47c and the respective outrigger 36c, and extends along with these members. Each of the second bridge portions 47d merges with the respective first bridge portion 47c in the merging portion 47f in the vicinity of the respective handle 36f. In the merging portion 47f, the angle between the first bridge portion 47c and the second bridge portion 47d is set to 45 degrees or greater but less than 90 degrees. As described, most of the second bridge portion 47d is provided along the first bridge portion 47c with a gap therebetween except for the proximal end portion and the distal end portion. Further, the second bridge portions 47d are located off the thin metal plate 44a, and not provided on top of the thin metal plate 44a.

In the gimbal portion 36, the conductive layer 44c of the multilayered member 41 comprises a plurality of signal traces 45a extending from the proximal end portion 47a to the distal end portion 47b through the second bridge portions 47d, the merging portions 47f and the first bridge portions 47c, and a plurality of drive traces 45b extending to the halfway point of the first bridge portions 47c from the proximal end portion 47a. The signal traces 45a are connected to a plurality of electrode pads 40d provided in the distal end portion 47b. Note that the drive traces 45b may be extended to the halfway point of the first bridge portions 47c from the proximal end portion 47a through the second bridge portions 47d and the merging portions 47f.

As shown in FIG. 6, in the gimbal portion 36, the first bridge portions 47c, the second bridge portions 47d, the signal traces 45a, the drive traces 45b of the multilayered member 41 and the outriggers 36c of the thin metal plate 44a, described above, are located in both sides of the tongue portion 36a, respectively, and are symmetrically formed with respect to the central axis C of the suspension 34.

As shown in FIGS. 3 to 6, the magnetic head 17 is fixed to the tongue portion 36a by adhesive. The magnetic head 17 is arranged so that the longitudinal axis line thereof coincides with the central axis C of the suspension 34, and also the substantially central portion of the magnetic head 17 is located above the dimple 48.

A recording/reading element of the magnetic head 17 is electrically connected to a plurality of electrode pads 40d of the distal end portion 47b with conductive adhesives such as solder or silver paste. Thus, the magnetic head 17 is connected to the signal traces 45a configured to transmit recording and reading signals through the electrode pads 40d. Note that by forming the second bridge portions 47d branched from the first bridge portions 47c and forming a plurality of signal traces 45a through the second bridge portions 47d, the signal traces 45a can be routed while detouring around the piezoelectric element 50.

A pair of piezoelectric elements 50, which function as drive elements, are, for example, thin-film piezoelectric elements (PZT elements) of a rectangular plate shape. As the piezoelectric elements 50, not only a thin-film type (about 10 μm in thickness) but a bulk type or bulk lamination type (not less than 50 μm in thickness) may be used. Alternatively, not only PZT elements but other types of piezoelectric elements may be used as the piezoelectric elements 50. Further, as the drive elements, not only piezoelectric elements but other types which can be expanded and contracted by application of current may be used.

As shown in FIGS. 3 to 6, the piezoelectric elements 50 are attached to the upper surfaces of the first bridge portions 47c, respectively, with adhesive, etc. In other words, each of the first bridge portions 47c formed of the multilayered members 41 comprises a lower surface opposing the thin metal plate 44a and an upper surface located on an opposite side to the lower surface, and a piezoelectric element 50 is attached to the upper surface. The piezoelectric elements 50 are disposed so that the longitudinal directions thereof (expansion/contraction directions) are parallel to the longitudinal directions of the load beam 35 and the first bridge portions 47c. The two piezoelectric elements 50 are arranged to be parallel to each other and also displaced to the proximal end portion 47a side of the multilayered member 41 with respect to the magnetic head 17 on both sides of the magnetic head 17. Note that the piezoelectric elements 50 may be arranged to incline towards the longitudinal directions of the first bridge portions 47c, and for example, the two piezoelectric elements 50 may be arrange in crossing directions such as a V-shape formation.

Each of the piezoelectric elements 50 is attached to the respective first bridge portion 47c in such a state that one of the longitudinal (expansion/contraction directions) end portions thereof overlaps the proximal end portion 36b of the thin metal plate 44a and the other overlaps the respective separation plate 36d. Each of the piezoelectric elements 50 is electrically connected to the drive traces 45b configured to transmit drive signals.

At least a part of each of the second bridge portions 47d arranged along the first bridge portions 47c with a gap therebetween, where the respective piezoelectric element 50 is mounted, is formed thinner than the rest of the multilayered member 41 (as to a total thickness of the films and layers) so as to form a thin portion 60. In this embodiment, for example, the longitudinal middle portion located by the piezoelectric element 50 in each of the second bridge portions 47d is formed into the thin portion 60 having a smaller thickness. The width of the thin portion 60 is the same as the width of the second bridge portion 47d. Note that not only partially, but the entire second bridge portion 47d may be formed thin. The location and length of the thin portion 60 formed in the second bridge portion 47d may be set optimally in consideration of the strength and rigidity of the multilayered the member 41 as a whole.

Figure 7B:
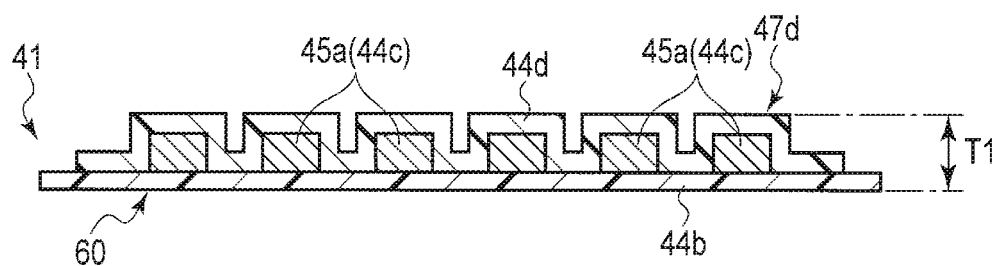
FIG. 7B is a cross sectional view of a thin part of the branching portion of the trace member taken along line B-B in FIG. 6.
Figure 7C:
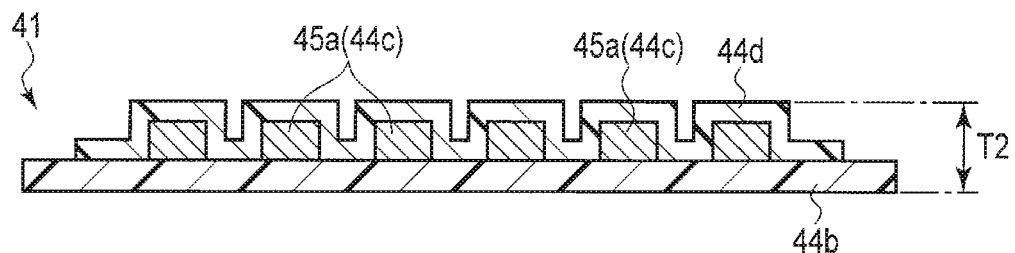
FIG. 7C is a cross sectional view of a non-thin part of the branching portion taken along line C-C in FIG. 6.

FIG. 7A is a longitudinal section of the second bridge portion 47d, FIG. 7B is a cross section of the thin portion 60 and FIG. 7C is a cross section of the other portion of the second bridge portion, which is not thinned (non-thinned portion). As shown in FIGS. 7A, 7B and 7C, the base insulating layer 44b in the thin portion 60 is formed thinner than the other portion (non-thinned portion) of the base insulating layer 44b of the multilayered member 41. For example, the thickness of the base insulating layer 44b in the non-thinned portion is 8 μm, whereas the thickness of the base insulating layer 44b in the thin portion 60 is 4 μm, which is substantially a half. Note that the difference in thickness between the base insulating layer 44b in the non-thinned portion and the thin portion 60 should desirably be 1 μm or more. Therefore, the thickness T1 of the thin portion 60 is set thinner than the thickness T2 of the other portion (non-thinned portion) of the multilayered member 41 by 1 μm or more.

The multilayered member 41 including the above-described thin portion 60 can be formed in the following process. That is, for example, after forming a base insulating layer, a photoresist is formed on the base insulating layer. The entire photoresist is exposed using a photomask including a part corresponding to the thin portion, which has light transmissivity and other parts having a different light transmissivity, followed by development. Further, the base insulating layer is etched with the obtained photoresist. Thus, a base insulating layer including a thin portion is formed. After that, a conductive layer and a cover insulating layer are stacked on the base insulating layer, and thus the multilayered member 41 including the thin portion 60 is obtained.

In an HDD having the above-described structure, the piezoelectric element 50 is expanded and contracted in the longitudinal directions thereof (the longitudinal directions of the first bridge portion 47c) when applying voltage (driving signal) to the piezoelectric element 50 through the drive traces 45b. As shown in FIG. 6 with an arrow E, the pair of first bridge portions 47c strokes in opposite directions from each other by driving the two piezoelectric elements 50 in reverse directions with respect to each other when they expand and contract. The first bridge portions 47c rock the tongue portion 36a and the magnetic head 17 of the gimbal portion 36 in the directions indicated by an arrow D around the dimple 48 via the handles 36f. Thus, the magnetic head 17 can be displaced by the expansion and contraction of the piezoelectric element 50. Note that the rocking direction D of the magnetic head 17 corresponds in the seek direction (the cross track direction) of the magnetic head 17 above the magnetic disk 16.

The second bridge portion 47d provided along the first bridge portion 47c, on which the respective piezoelectric element 50 is mounted, includes the thin portions 60. Therefore, the rigidity of the second bridge portion 47d is lower than those of the other portions of the multilayered member 41. Consequently, the driving force by the expansion and contraction of the piezoelectric element 50 does not easily propagate to the second bridge portion 47d, and thus the driving force can be propagated directly to the first bridge portion 47c and the handle 36f. For this reason, the stroke (movement) of the piezoelectric element 50 and the first bridge portion 47c per unit voltage can be improved or increased without changing the characteristics or size of the piezoelectric element 50. In this manner, the position of the magnetic head 17 can be controlled with higher accuracy and in a wider range.

FIG. 8 shows the results of comparisons between various types of suspension assemblies based on simulations of the stroke (the displacement in the longitudinal direction) of the first bridge portion caused by expansion and contraction of the piezoelectric element. In FIG. 8, case (a) indicates the stroke of the suspension assembly in which the base insulating layer does not include a thin portion, case (b) indicates the stroke of the suspension assembly according to this embodiment by which the thin portion is formed in the second bridge portion, and case (c) indicates the stroke of the suspension assembly in which the thin portion is formed in both the second bridge portion and the first bridge portion. Further, FIG. 8 indicates the ratio in stroke between the cases (a), (b) and (c) when setting the stroke of case (a) to 1.

From FIG. 8, it can be understood that the stroke of the suspension assembly of case (b), which is the present embodiment, is increased by about 3% as compared to the case (a). Further, when the first bridge portion is formed to include a thin portion in addition to the second bridge portion as in the case (c), the stroke of the suspension assembly is decreased by 2% as compared to the case (a). This result indicates that the reduction in the rigidity of the second bridge portion in the case (b) is effective for increasing the stroke. In other words, it is desirable that the thin portion be formed only in the second bridge portion, but in no other portions.

As described above, according to the first embodiment, it is possible to provide a suspension assembly which can be improve the strokes without having to change the characteristics or size of the drive element, such a head suspension assembly and a magnetic disk comprising this assembly.

Next, a head suspension assembly for an HDD, according to another embodiment will now be described. In the embodiment described below, the same structural elements as those of the first embodiment described above are designated by the same referential symbols, and the detailed explanations therefor are omitted.

Second Embodiment

FIG. 9 is a cross section of a thin portion of a head suspension assembly according to a second embodiment. According to the second embodiment, in a thin portion 60 of a second bridge portion 47d, the thickness of a cover insulating layer 44d is set less than the thickness of the cover insulating layer 44d in other portions (non-thinned portion) (FIG. 7C) of the multilayered member 41. For example, the thickness of the cover insulating layer 44d in the non-thinned portions is 5 µm, whereas the thickness of the cover insulating layer 44d in the thinned portion is 3 µm. The difference in thickness between the cover insulating layer 44d in the non-thinned portions shown in FIG. 7C and the cover insulating layer 44d in the thin portion 60 shown in FIG. 9 should desirably be 1 µm or more. Therefore, the thickness T1 of the thin portion 60 is set less than the thickness T2 of the other portions (non-thinned portions) of the multilayered member 41 by 1 µm or more.

The multilayered member 41 including the above-described thin portion 60 can be formed in the following process. That is, for example, after forming the base insulating layer 44b, the conductive layer 44c and the cover insulating layer 44d are stacked on the base insulating layer 44b in this order. Then, a photoresist is formed on the cover insulating layer 44d, and the photoresist is exposed using a photomask including a part opposing the thin portion, which has a light transmissivity different from that of the other parts, followed by development. Further, the cover insulating layer is etched with the obtained photoresist. Thus, the cover insulating layer 44d including the thin portion 60 is formed.

In the second embodiment, the other structural parts of the HDD and the head suspension assembly are the same as those of the HDD and the head suspension assembly according to the first embodiment. With the second embodiment, an advantageous effect similar to that of the first embodiment can be obtained.

Third Embodiment

FIG. 10 is a cross section of a thin portion of a head suspension assembly according to a third embodiment. According to the third embodiment, a cover insulating layer 44d is removed from a thin portion 60 of a second bridge portion 47d. An exposed conductive layer 44c, that is, signal traces 45a and an upper surface of a base insulating layer 44b are covered by a plating layer 45f of nickel/Au plating or the like, for antirust processing. The thickness of the plating layer 45f is about 0.05 µm.

With this structure, the thickness T1 of the thin portion 60 is set less than the thickness T2 of the other portions (non-thinned portions) of the multilayered member 41 by 1 µm or more, for example, about 5 µm.

In the third embodiment, the other structural parts of the HDD and the head suspension assembly are the same as those of the HDD and the head suspension assembly according to the first embodiment. With the third embodiment, an advantageous effect similar to that of the first embodiment can be obtained.

Fourth Embodiment

Figure 11:
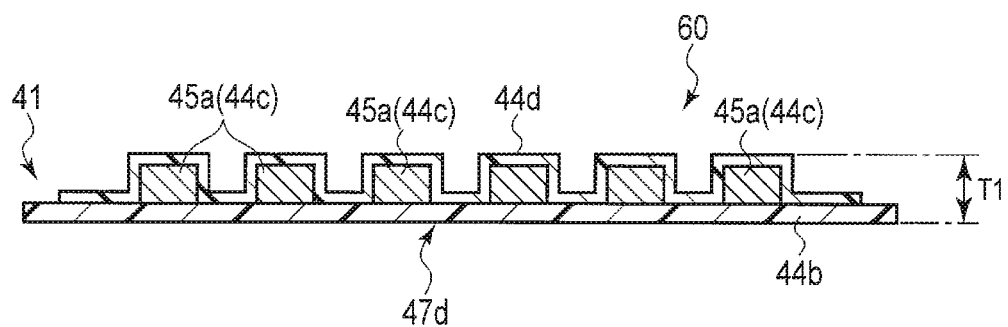
FIG. 11 is a cross sectional view of a thin part of a trace member in a suspension assembly according to a fourth embodiment.

FIG. 11 is a cross section of a thin portion of a head suspension assembly according to a fourth embodiment. According to the fourth embodiment, in a thin portion 60 of a second bridge portion 47d, the thickness of a base insulating layer 44b is set less than the thickness of the base insulating layer 44b in other portions (non-thinned portion) of the multilayered member 41. For example, the thickness of the base insulating layer 44b in the non-thinned portion is 8 µm, whereas the thickness of the base insulating layer 44b in the thin portion 60 is 4 µm, which is substantially a half thickness. Further, the thickness of the cover insulating layer 44d in the thin portion is set less than the thickness of the cover insulating layer 44d of the other portions (non-thinned portion) of the multilayered member 41. For example, the thickness of the cover insulating layer 44d in the non-thinned portion is 3 µm, whereas the thickness of the cover insulating layer 44d in the thin portion 60 is 3 µm. With this structure, the thickness T1 of the thin portion 60 is set less than the thickness T2 of the other portions (non-thinned portions) of the multilayered member 41 by 1 µm or more, for example, about 6 µm.

Thus, with the fourth embodiment, an advantageous effect similar to that of the first embodiment can be obtained. Further, according to the fourth embodiment, the thickness T1 of the thin portion 60 can be less than that in the first embodiment, to make the rigidity of the second bridge portion 47d even lower. Thus, transmission of the driving force produced by the expansion and contraction of the drive element 50 to the second bridge portion 47d can be reduced further, and the stroke of the first bridge portion 47c (movement) can be increased more.

Fifth Embodiment

Figure 12:
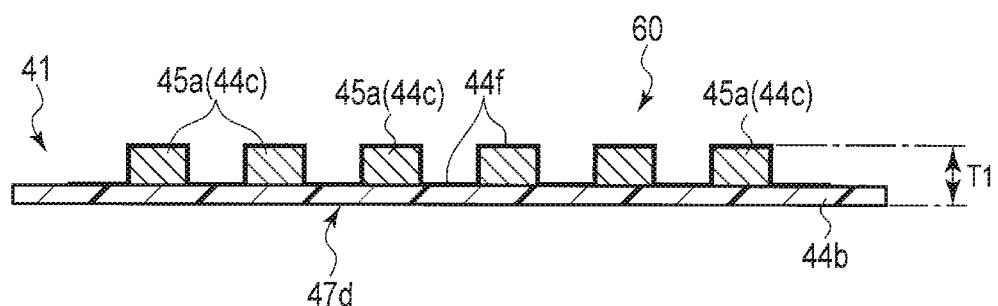
FIG. 12 is a cross sectional view of a thin part of a trace member in a suspension assembly according to a fifth embodiment.

FIG. 12 is a cross section of a thin portion of a head suspension assembly according to the fifth embodiment. According to the fifth embodiment, in a thin portion 60 of a second bridge portion 47d, the thickness of a base insulating layer 44b is set less than the thickness of the base insulating layer 44b in other portions (non-thinned portion) of the multilayered member 41. For example, the thickness of the base insulating layer 44b in the non-thinned portion is 8 µm, whereas the thickness of the base insulating layer 44b in the thin portion 60 is 4 µm, which is substantially a half thickness. Further, a cover insulating layer 44d is removed from the thin portion 60 of the second bridge portion 47d. An exposed conductive layer 44c, that is, signal traces 45a and an exposed upper surface of the base insulating layer 44b are covered by a plating layer 45f of nickel/Au plating or the like, for antirust processing. With this structure, the thickness T1 of the thin portion 60 is set less than the thickness T2 of the other portions (non-thinned portions) of the multilayered member 41 by 1 µm or more, for example, about 9 µm.

According to the fifth embodiment of the above-described structure, the thickness T1 of the thin portion 60 can be even less as compared to that in the fourth embodiment. Thus, the stroke of the multilayered member and the first bridge portion, produced by the expansion and contraction of the drive element can be further improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the embodiments described above have such structure that a pair of drive elements 50 are attached to the gimbal portion 36 and located in the proximal end side of the load beam 35 with respect to the magnetic head 17, but the structure is not limited to this. A pair of drive elements may be arranged, for example, on both width sides of the support portion (tongue portion) which supports the magnetic head and may be located in a line with the magnetic head. As to the piezoelectric elements, it is not limited to a pair, but, for example, a single drive element may be used.

Moreover, in the disk device, the type of the magnetic disk is not limited to 2.5 inches, but magnetic disks of other sizes may also be used. The number of magnetic disks is not limited to two, but one or three or more disks may also be used. The number of suspension assemblies may be decreased or increased according to the number of magnetic disks installed.

What is claimed is:

1. A disk device comprising:
   a housing;
   a disk recording medium in the housing;
   a suspension assembly in the housing, the suspension assembly comprising:
   a support plate;
   a pair of drive elements;
   a trace member provided on the support plate; and
   a magnetic head mounted on the trace member;
   wherein the trace member comprises a metal plate and a multilayered material on the metal plate,
   the multilayered material comprises a first insulating layer, a second insulating layer, and a conductive layer between the first insulating layer and the second insulating layer, and the conductive layer is electrically connected with the magnetic head,
   the multilayered material comprises a first portion and a second portion farther from the magnetic head and from at least one of the drive elements than the first portion, and a thickness of the second portion is less than a thickness of the first portion, and the drive elements are arranged on both sides of the magnetic head.

2. The disk device of claim 1, wherein the second portion of the multilayered material is located closer to the drive element than the first portion of the multilayered material.

3. The disk device of claim 1, wherein the second portion of the multilayered material is located closer to the drive element than at least a part of the first portion of the multilayered material.

4. The disk device of claim 1, wherein the second portion of the multilayered material is arranged side by side with the drive element.

5. The disk device of claim 1, wherein
   the first insulating layer includes a third insulating layer provided at the first portion and a forth insulating layer provided at the second portion,
   the second insulating layer includes a fifth insulating layer provided at the first portion and a sixth insulating layer provided at the second portion, and
   the conductive layer includes a first conductive layer provided at the first portion and a second conductive layer provided at the second portion.

6. The disk device of claim 5, wherein the fourth insulating layer has a thickness smaller than a thickness of the third insulating layer, or the sixth insulating layer has a thickness smaller than a thickness of the fifth insulating layer.

7. The disk device of claim 6, wherein the first conductive layer and the second conductive layer are electrically connected to each other, and have a substantially same thickness.

8. The disk device of claim 5, wherein difference in thickness between the third insulating layer and the fourth insulating layer of the multilayered member is 1 µm or more, and difference in thickness between the fifth insulating layer and the sixth insulating layer of the multilayered member is 1 µm or more.

* * * * *